(12) United States Patent
Sio et al.

(10) Patent No.: US 12,327,786 B2
(45) Date of Patent: *Jun. 10, 2025

(54) DECOUPLING CAPACITORS WITH BACK SIDE POWER RAILS

(71) Applicant: Taiwan Semiconductor Manufacturing Company, Ltd., Hsinchu (TW)

(72) Inventors: Kam-Tou Sio, Zhubei (TW); Jiann-Tyng Tzeng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/606,944

(22) Filed: Mar. 15, 2024

(65) Prior Publication Data
US 2024/0222264 A1 Jul. 4, 2024

Related U.S. Application Data

(63) Continuation of application No. 17/370,902, filed on Jul. 8, 2021, now Pat. No. 11,942,413.

(51) Int. Cl.
*H01L 23/522* (2006.01)
*H01L 21/02* (2006.01)
(Continued)

(52) U.S. Cl.
CPC ...... *H01L 23/5223* (2013.01); *H01L 21/0259* (2013.01); *H01L 23/5286* (2013.01);
(Continued)

(58) Field of Classification Search
CPC ............. H01L 23/5223; H01L 21/0259; H01L 21/823807; H01L 21/823871;
(Continued)

(56) References Cited

U.S. PATENT DOCUMENTS 11,942,413 B2 * 3/2024 Sio .................. H01L 21/823807
2017/0005087 A1 1/2017 Cheng et al.
(Continued)

OTHER PUBLICATIONS

Non-Final Office Action on U.S. Appl. No. 17/370,902 Dtd Aug. 1, 2023.
(Continued)

*Primary Examiner* — Tong-Ho Kim
(74) *Attorney, Agent, or Firm* — FOLEY & LARDNER LLP

(57) ABSTRACT

A semiconductor device includes a substrate having a first side and a second side; an active region arranged on the first side, and extending along a first lateral direction; a first gate structure arranged on the first side, extending along a second lateral direction perpendicular to the first lateral direction, disposed over the active region, and wrapping a first portion of the active region; a first interconnecting structure arranged on the first side, electrically coupled to the first gate structure, and disposed over the first gate structure; and a second interconnecting structure arranged on the second side, and electrically coupled to one or more portions of the active region. The active region, the first gate structure, the first interconnecting structure, and the second interconnecting structure are collectively configured as a decoupling capacitor.

20 Claims, 13 Drawing Sheets

(51) Int. Cl.
    *H01L 21/8238*    (2006.01)
    *H01L 23/528*     (2006.01)
    *H01L 27/092*     (2006.01)
    *H01L 29/06*      (2006.01)
    *H01L 29/423*     (2006.01)
    *H01L 29/66*      (2006.01)
    *H01L 29/786*     (2006.01)
    *H10D 30/01*     (2025.01)
    *H10D 30/67*     (2025.01)
    *H10D 62/10*     (2025.01)
    *H10D 84/01*     (2025.01)
    *H10D 84/03*     (2025.01)
    *H10D 84/85*     (2025.01)

(52) U.S. Cl.
    CPC ....... *H10D 30/031* (2025.01); *H10D 30/6735* (2025.01); *H10D 30/6757* (2025.01); *H10D 62/118* (2025.01); *H10D 84/0167* (2025.01); *H10D 84/0186* (2025.01); *H10D 84/038* (2025.01); *H10D 84/85* (2025.01)

(58) Field of Classification Search
    CPC ............... H01L 23/5286; H01L 27/092; H01L 29/0665; H01L 29/42392; H01L 29/66742; H01L 29/78696; H01L 27/0207; H01L 28/40; H01L 29/0673; H01L 29/66439; H01L 29/66795; H01L 29/775; H01L 27/0629; H01L 21/823475; H01L 21/823431; H01L 21/823437; H01L 23/642; H01L 27/0886; B82Y 10/00
    USPC ........................................................ 257/351
    See application file for complete search history.

(56) References Cited

U.S. PATENT DOCUMENTS

2018/0145071 A1\*   5/2018   Zhao .................... H03K 17/162
2021/0083129 A1    3/2021   Liu et al.
2021/0118882 A1    4/2021   Tsai et al.

OTHER PUBLICATIONS

Notice of Allowance on U.S. Appl. No. 17/370,902 Dtd Nov. 20, 2023.

\* cited by examiner

DECOUPLING CAPACITORS WITH BACK SIDE POWER RAILS

CROSS-REFERENCE TO RELATED APPLICATION

This application is a continuation application of U.S. Utility application Ser. No. 17/370,902, filed Jul. 8, 2021, titled "DECOUPLING CAPACITORS WITH BACK SIDE POWER RAILS," the entire contents of which are incorporated herein by reference for all purposes.

BACKGROUND

The present disclosure generally relates to semiconductor devices, and particularly to methods of making a decoupling capacitor.

During the operation of certain integrated circuits, power supply lines may supply transient currents with a relatively high intensity. These conditions can result in noise on the power supply lines. For example, the voltage on the power supply line may fluctuate when the transition time of the transient current is particularly short or when the line's parasitic inductance or parasitic resistance is large. To ameliorate such conditions, decoupling capacitors are typically used, acting as temporary charge reservoirs to prevent momentary fluctuations in supply voltage.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
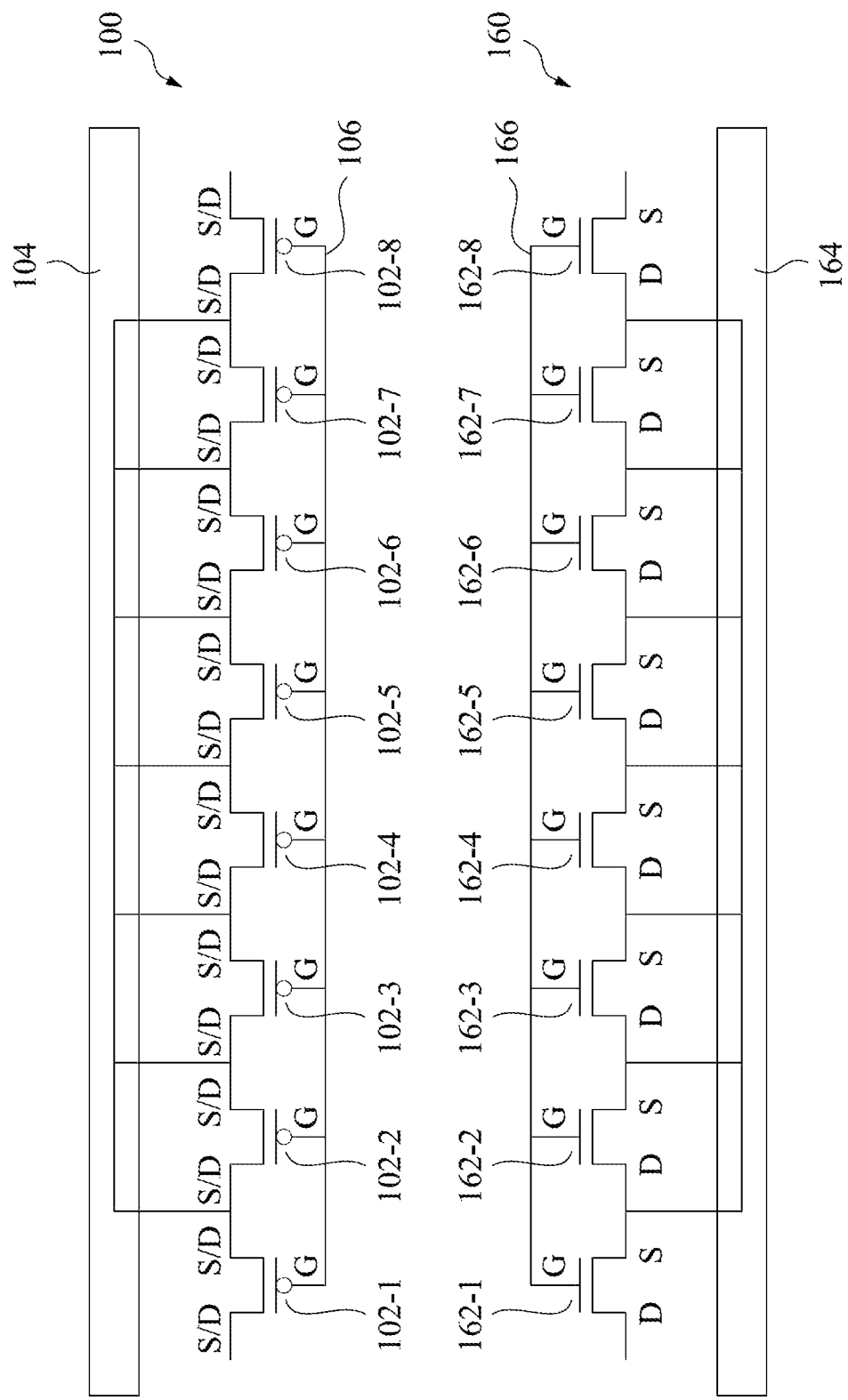
FIG. 1 illustrates a schematic diagram of one or more decoupling capacitors, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various embodiments of a decoupling capacitor. The decoupling capacitor, as disclosed herein, is coupled to (or includes) an interconnecting structure that is configured to provide (e.g., carry) a power supply, e.g., VDD (a relatively high voltage) or VSS (a relatively low, or ground voltage). The decoupling capacitor can help stabilize the power supply carried by (or otherwise present on) the interconnecting structure. In accordance with various embodiments, a portion of the decoupling capacitor can be formed on the first side of a semiconductor substrate, and another portion of the decoupling capacitor can be formed on the second, opposite side of the semiconductor substrate. For example, the decoupling capacitor may include a number of transistors, with their respective source/drain structures connected to one another, and an interconnecting structure connecting the associated gate structures of the source/drain structures that are formed over the front side of a semiconductor substrate, and the interconnecting structure providing either of the power supplies (sometimes referred to as a "power rail") that is formed over the back side of the semiconductor substrate. By forming a portion of the decoupling capacitor on a different side of a substrate, a size of the decoupling capacitor can be reduced, which may make deployment of the disclosed decoupling capacitor easier. Further, a total capacitance value of the decoupling capacitor can be significantly increased, which may further stabilize the corresponding power supply.

FIG. 1 illustrates a schematic diagram of a decoupling capacitor 100 and a decoupling capacitor 160, in accordance with various embodiments. Each of the decoupling capacitors 100 and 160 can include a number of transistors, with a source or drain of one of the transistors connected to a source or drain of another of the transistors. Further, respective gates of the transistors are tied together by a first interconnecting structure, and the connected sources and drains are tied together to a second interconnecting structure configured to provide a power supply (sometimes referred to as a "power rail"). As such, each of the decoupling capacitors 100 and 160 can be formed between its respective first and second interconnecting structures.

For example, the decoupling capacitor 100 includes a number of transistors: 102-1, 102-2, 102-3, 102-4, 102-5, 102-6, 102-7, and 102-8. Although eight transistors are shown in FIG. 1, it should be understood that the decoupling capacitor 100 can include any number of transistors while remaining within the scope of the present disclosure. In an embodiment, each of the transistors 102-1 through 102-8 includes a p-type transistor. Further, one of the transistor 102-1's source/drain (structures) is connected to one of the transistor 102-2's source/drain (structures); the other of the transistor 102-2's source/drain (structures) is connected to one of the transistor 102-3's source/drain (structures); and so on. Such connected source/drain (structures) of the transistors 102-1 through 102-8 are all connected to an interconnecting structure 104. The interconnecting structure 104 may can provide a power supply, e.g., VDD, and thus, the interconnecting structure 104 may herein be referred to as "VDD power rail 104." Still further, respective gates of the transistors 102-1 through 102-8 are all connected together via an interconnecting structure 106. In some embodiments, the sources/drains of the transistors 102-1 through 102-8 and the interconnecting structure 106 may be formed on the first side of a semiconductor substrate; and the VDD power rail 104 may be formed on the second side of the semiconductor substrate, which will be discussed in further detail below.

In another example, the decoupling capacitor 160 includes a number of transistors: 162-1, 162-2, 162-3, 162-4, 162-5, 162-6, 162-7, and 162-8. Although eight transistors are shown in FIG. 1, it should be understood that the decoupling capacitor 160 can include any number of transistors while remaining within the scope of the present disclosure. In an embodiment, each of the transistors 162-1 through 162-8 includes an n-type transistor. Further, one of the transistor 162-1's source/drain (structures) is connected to one of the transistor 162-2's source/drain (structures); the other of the transistor 162-2's source/drain (structures) is connected to one of the transistor 162-3's source/drain (structures); and so on. Such connected source/drain (structures) of the transistors 162-1 through 162-8 are all connected to an interconnecting structure 154. The interconnecting structure 154 may can provide a power supply, e.g., VSS, and thus, the interconnecting structure 154 may herein be referred to as "VSS power rail 154." Still further, respective gates of the transistors 162-1 through 162-8 are all connected together via an interconnecting structure 166. In some embodiments, the sources/drains of the transistors 162-1 through 162-8 and the interconnecting structure 166 may be formed on the first side of a semiconductor substrate; and the VSS power rail 154 may be formed on the second side of the semiconductor substrate, which will be discussed in further detail below.

Figure 2:
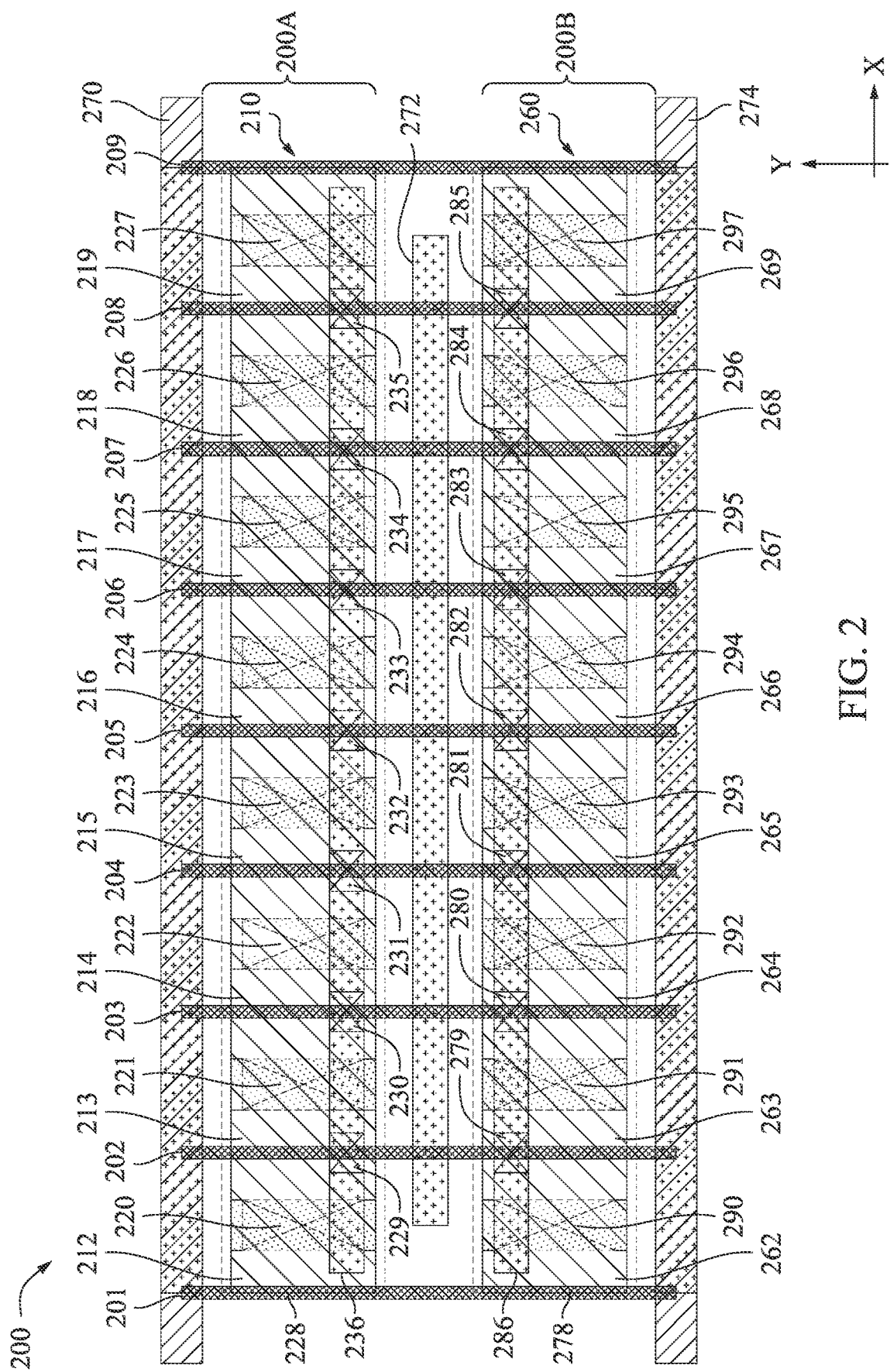
FIG. 2 illustrates a layout design of decoupling capacitor that includes (or is coupled to) a back side power rail, in accordance with some embodiments.

Referring to FIG. 2, an example layout design 200 of an integrated circuit is depicted, in accordance with some embodiments. The layout design 200 includes two (standard) cells, 200A and 200B, abutted to each other along the Y direction. The cells 200A and 200B may sometimes be referred to as a top cell and a bottom cell, respectively. Each of the cells 200A-B may function as a respective circuit that includes one or more transistors operatively coupled to one another. For example, the cells 200A and 200B can be used to fabricate the decoupling capacitors 100 and 160, respectively, as shown in FIG. 1. It should be appreciated that the layout design 200 is simplified to include only the patterns used to form major features/structures of each of the decoupling capacitors 100 and 160. Thus, the layout design 200 can include other patterns to form various features of the respective decoupling capacitors while remaining within the scope of the present disclosure.

The layout design 200 includes patterns 210 and 260. The patterns 210 and 260 may extend along the X direction, each of which is configured to form an active region over a substrate (hereinafter "active regions 210 and 260," respectively). The active regions 210 and 260 may each include a respective conduction type of dopants. For example, the active region 210 may include p-type of dopants; and the active region 260 may include n-type of dopants. The active regions 210 and 260 may be formed on a front side of the substrate. Such an active region may form a fin-shaped region of one or more three-dimensional field-effect-transistors (e.g., FinFETs), a sheet-shaped region of one or more gate-all-around (GAA) transistors (e.g., nanosheet transistors), a wire-shaped region of one or more GAA transistors (e.g., nanowire transistors), or an oxide-definition (OD) region of one or more planar metal-oxide-semiconductor field-effect-transistors (MOSFETs). Portions of the active region may each serve as a source structure or drain structure (or feature) of the respective transistor(s); and portions of the active region may each serve as a conduction channel of the respective transistor(s).

In an example where the layout design 200 is used to fabricate one or more GAA transistors, the portion of each of the active regions 210 and 260, overlaid by a gate structure (e.g., 201-209, which will be discussed below), can form a number of sets of nanostructures (e.g., nanosheets, nanowires, etc.) that are vertically separated from each other and extend along the X direction. Each of such sets of nanostructures can be configured as the channel of a respective GAA transistor. The portion of each of the active regions 210 and 260, not overlaid by a gate structure (e.g., 212-219, 262-269, which will also be discussed below), can form either a source or a drain structure of the respective GAA transistor. For instance, the active region 210, which includes p-type of dopants, may be used to form respective channels, source structures, and drain structures of the transistors 102-1 through 102-8 of the decoupling transistor 100; and the active region 260, which includes n-type of dopants, may be used to form respective channels, source structures, and drain structures of the transistors 162-1 through 162-8 of the decoupling transistor 160.

The layout design 200 includes patterns 201, 202, 203, 204, 205, 206, 207, 208, and 209. The patterns 201-209 may extend along the Y direction, that are configured to form gate structures (hereinafter "gate structures 201-209," respectively). In an embodiment, the gate structures 201-209 may be initially formed as dummy (e.g., polysilicon) gate structures straddling respective portions of the active regions 210-260, and be later replaced by active (e.g., metal) gate structures.

In some embodiments, the gate structure 201 may be disposed along or over a first boundary of the layout design 200 (or the cells 200A-B), and the gate structure 209 may be disposed along or over a second boundary of the layout design 200 (or the cells 200A-B). The gate structures 201 and 209 may not provide an electrical or conductive path, and may prevent or at least reduce/minimize current leakage across components between which the gate structures 201 and 209 are located. The gate structures 201 and 209 can include polysilicon lines or metal lines, which are sometimes referred to as poly on OD edge (PODEs). Such PODEs and the underlying active/dummy regions may be replaced with a dielectric material so as to electrically isolate the cells 201A-B from cells laterally (e.g., along the X direction) abutted to them.

In some embodiments, each of the remaining gate structures 202-208, formed of one or more conductive materials (e.g., polysilicon(s), metal(s)), can overlay (e.g., wrap around) respective portions of the active regions 210-260 to define one or more transistors. Continuing with the above example where the layout design 200 is used to fabricate one or more GAA transistors, each of the gate structures 202-208 may correspond to a metal gate wrapping around respective portions of the active regions 210-260, with the non-overlapped portions of the active regions such as, 212, 213, 214, 215, 216, 217, 218, 219, 262, 263, 264, 265, 267, 268, and 269 serving as respective source/drain structures of the one or more GAA transistors.

The layout design 200 includes patterns 270, 272, and 274. The patterns 270-274 may extend along the X direction, each of which is configured to form a gate isolation structure (hereinafter "gate isolation structures 270-274," respectively). As shown in FIG. 2, the gate isolation structure 270 is disposed between the cell 200A and a cell (not shown) abutted to it along the Y direction to cut or otherwise disconnect the gate structures 202-208; the gate isolation structure 272 is disposed between the active regions 210 and 260 to cut or otherwise disconnect the gate structures 202-208; and the gate isolation structure 274 is disposed between the cell 200B and a cell (not shown) abutted to it along the Y direction to cut or otherwise disconnect the gate structures 202-208. Accordingly, such gate isolation structures may sometimes be referred to as cut poly structures.

The layout design 200, over the top cell 200A, includes patterns 220, 221, 222, 223, 224, 225, 226, and 227. The patterns 220-227 are configured to form via interconnecting structures (hereinafter "via structures 220-227," respectively). The via structures 220-227 can respectively connect the source/drain structures 212-219 to an interconnecting structure formed by a pattern 228 (hereinafter "interconnecting structure 228"). Similarly, the layout design 200, over the top cell 200B, includes patterns 290, 291, 292, 293, 294, 295, 296, and 297. The patterns 290-297 are configured to form via interconnecting structures (hereinafter "via structures 290-297," respectively). The via structures 290-297 can respectively connect the source/drain structures 262-269 to an interconnecting structure formed by a pattern 278 (hereinafter "interconnecting structure 278"). The interconnecting structures 228 and 278 may be formed on a back side of the substrate, which is opposite to the front side on which the active regions 210 and 260 are formed. In some embodiments, the interconnecting structure 228 is configured to carry a power supply, e.g., VDD, which may correspond to the power rail 104 shown in FIG. 1; and the interconnecting structure 278 is configured to carry a power supply, e.g., VSS, which may correspond to the power rail 164 shown in FIG. 1.

The layout design 200, over the cell 200A, includes patterns 229, 230, 231, 232, 233, 234, and 235. The patterns 229-235 are configured to form via interconnecting structures (hereinafter "via structures 229-235," respectively). The via structures 229-235 can respectively connect the cut portions of the gate structures 202-208 in the cell 200A to an interconnecting structure formed by a pattern 236 (hereinafter "interconnecting structure 236"). Similarly, the layout design 200, over the cell 200B, includes patterns 279, 280, 281, 282, 283, 284, 285. The patterns 279-285 are configured to form via interconnecting structures (hereinafter "via structures 279-285," respectively). The via structures 279-285 can respectively connect the cut portions of gate structures 202-208 in the cell 200B to an interconnecting structure formed by a pattern 286 (hereinafter "interconnecting structure 286"). The interconnecting structures 236 and 286 may be formed on the front side of the substrate, which is the same side on which the active regions 210 and 260 are formed. In some embodiments, the interconnecting structure 236 may correspond to the interconnecting structure 106 shown in FIG. 1; and the interconnecting structure 286 may correspond to the interconnecting structure 166 shown in FIG. 1.

Figure 3A:
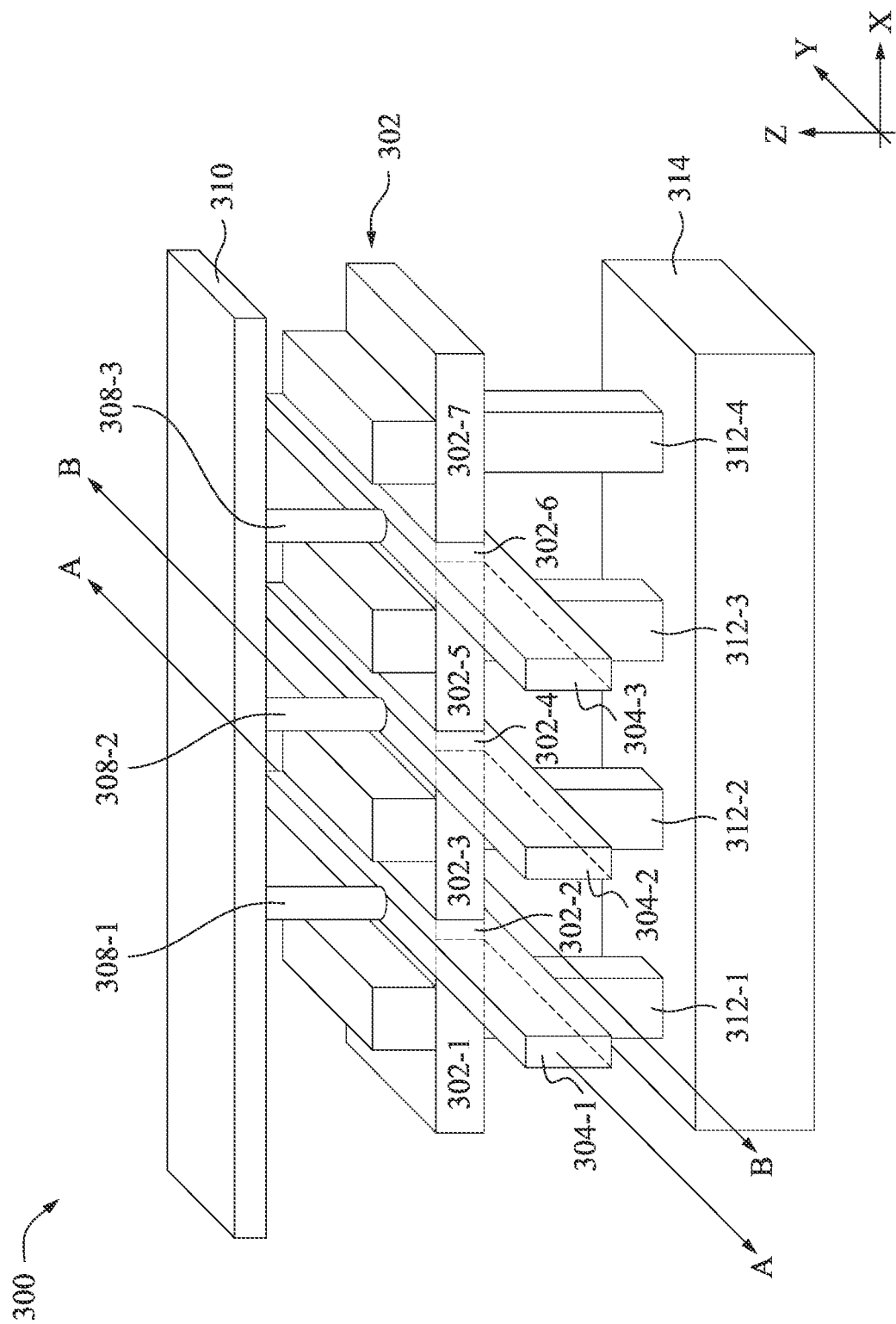
FIGS. 3A and 3B respectively illustrate a perspective view and top view of an example decoupling capacitor, made based on the layout design of FIG. 2, in accordance with some embodiments.
Figure 3B:
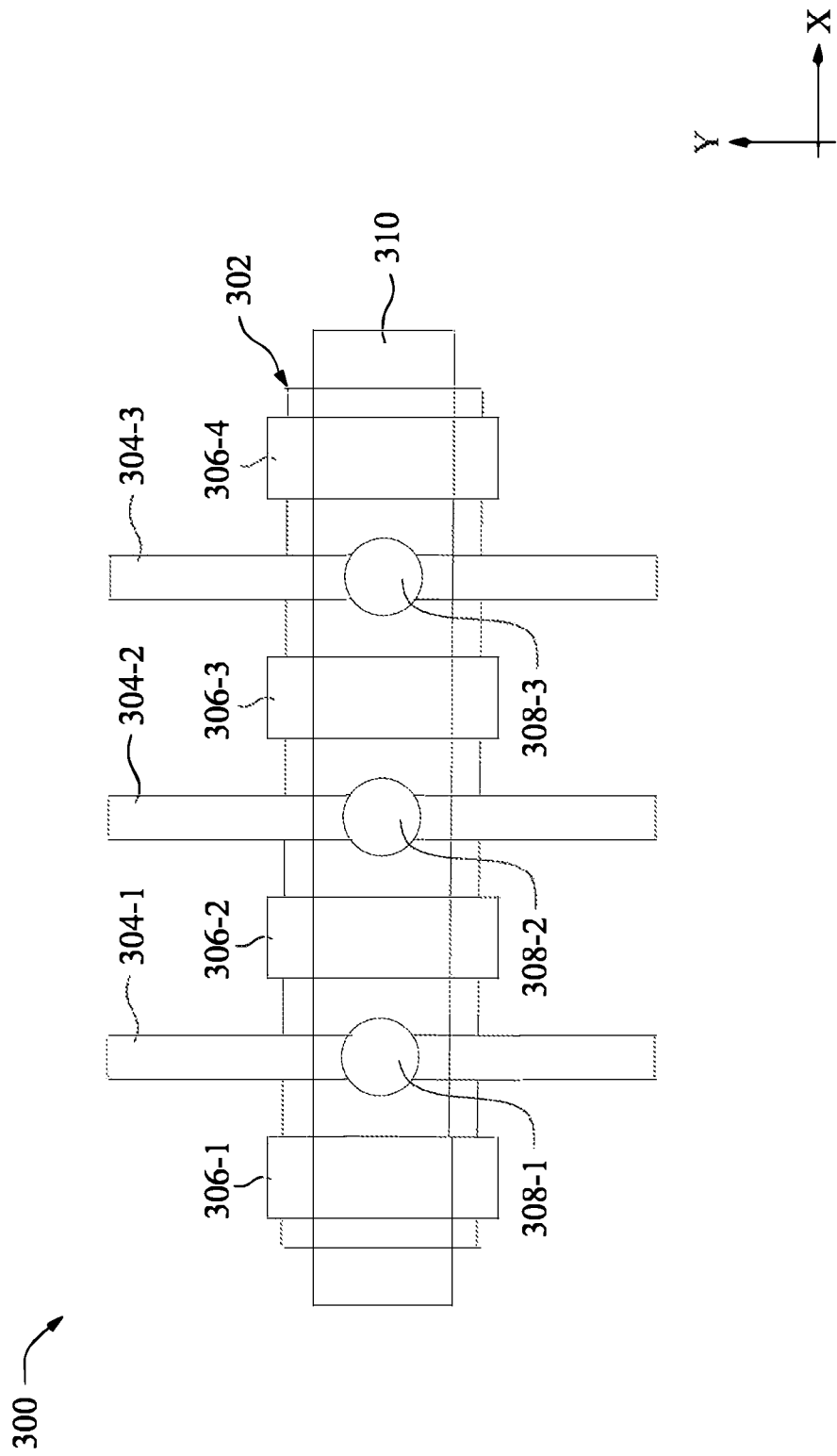

FIG. 3A illustrates a perspective view of an example decoupling capacitor 300, and FIG. 3B illustrates a corresponding top view of the example decoupling capacitor 300. The decoupling capacitor 300 can be fabricated based on at least a portion of the layout design 200 of FIG. 2, e.g., the cell 200A or 200B. For example, the decoupling capacitor 300 includes a number of transistors formed on a front side of a substrate and a power rail formed on a back side of the substrate. Accordingly, the following discussions of FIGS. 3A-B may be in conjunction with FIG. 2. In the illustrated embodiments of FIGS. 3A-B, the transistors constituting the decoupling capacitor 300 are respectively implemented as GAA transistors. However, it should be understood that the transistors can be implemented as any of various other types of transistors, while remaining within the scope of the present disclosure.

As shown in FIG. 3A, the decoupling capacitor 300 includes an active region 302, which may include a number of portions (or sub-regions) 302-1, 302-2, 302-3, 302-4, 302-5, 302-6, and 302-7. The active region 302 may be formed based on the pattern 210 or 260 of FIG. 2. The decoupling capacitor 300 includes (e.g., active) gate structures 304-1, 304-2, and 304-3. The gate structures 304-1 through 304-3 may be formed based on three of the patterns 201-208 of FIG. 2.

In accordance with various embodiments, the gate structure 304-1 can wrap around each of the nanostructures (e.g., nanosheets) of the portion 302-2 that collectively function as the channel of a first GAA transistor; the gate structure 304-2 can wrap around each of the nanostructures (e.g., nanosheets) of the portion 302-4 that collectively function as the channel of a second GAA transistor; and the gate structure 304-3 can wrap around each of the nanostructures (e.g., nanosheets) of the portion 302-6 that collectively function as the channel of a third GAA transistor. Further, the portions 302-1 and 302-3 disposed on opposite sides of the gate structure 304-1 may function as respective source/drain structures of the first GAA transistor; the portions 302-3 and 302-5 disposed on opposite sides of the gate structure 304-2 may function as respective source/drain structures of the second GAA transistor; and the portions 302-5 and 302-7 disposed on opposite sides of the gate structure 304-3 may function as respective source/drain structures of the third GAA transistor.

The decoupling capacitor 300 includes interconnecting structures 306-1, 306-2, 306-3, and 306-4 disposed over (e.g., electrically connected to) the portions (source/drain structures) 302-1, 302-3, 302-5, and 302-7, respectively. Such interconnecting structures 306-1-4, connecting to the source/drain structures, may sometimes be referred to as MD. By including one or more such MDs, a total capacitance value of the decoupling capacitor 300 may be increased. The decoupling capacitor 300 further includes interconnecting structures 308-1, 308-2, and 308-3. The interconnecting structures 308-1-3 may be formed based on three of the patterns 229-235 or 279-285 of FIG. 2. The interconnecting structures 308-1-3 are disposed over (e.g., electrically connected to) the gate structures 304-1-3, respectively. Such interconnecting structures 308-1-3, connecting to the gate structures, may sometimes be referred to as VG. The decoupling capacitor 300 further includes an interconnecting structure 310. The interconnecting structures 310 may be formed based on the pattern 236 or 286 of FIG. 2. The interconnecting structure 310 can electrically tie the gate structures 304-1 through 304-3 together through the interconnecting structures 308-1-3.

In some embodiments, the active region 302, the gate structures 304-1 through 304-3, and the interconnecting structures 306-1 through 306-4, 308-1 through 308-3, and 310 are formed on a front side of a substrate (not shown). Specifically, the interconnecting structure 310 may be disposed in one of a number of metallization layers on the front side (e.g., a bottommost metallization layer on the front side, typically referred to as M0). The substrate may include a semiconductor material substrate, for example, silicon. Alternatively, the substrate may include other elementary semiconductor material such as, for example, germanium. The substrate may also include a compound semiconductor such as silicon carbide, gallium arsenic, indium arsenide, and indium phosphide. The substrate may include an alloy semiconductor such as silicon germanium, silicon germanium carbide, gallium arsenic phosphide, and gallium indium phosphide. In one embodiment, the substrate includes an epitaxial layer. For example, the substrate may have an epitaxial layer overlying a bulk semiconductor. Furthermore, the substrate may include a semiconductor-on-insulator (SOI) structure. For example, the substrate may include a buried oxide (BOX) layer formed by a process such as separation by implanted oxygen (SIMOX) or other suitable technique, such as wafer bonding and grinding.

On a back side of the substrate, the decoupling capacitor 300 further includes a power rail 314 configured to carry VDD or VSS. The power rail 314 may be disposed in one of a number of metallization layers on the back side (e.g., a bottommost metallization layer on the back side, typically referred to as BM0). The power rail 314 may be formed based on the pattern 228 or 278 of FIG. 2. The power rail 314 is electrically connected to the source/drain structures 302-1, 302-3, 302-5, and 302-7 through interconnecting structures 312-1, 312-2, 312-3, and 312-4, respectively. The interconnecting structures 312-1 through 312-4 may be formed based on four of the patterns 220-227 or 270-277 of FIG. 2. The interconnecting structures 312-1 through 312-4, connecting one or more back side interconnecting structures, may sometimes be referred to as VB. In some embodiments, the interconnecting structures 312-1-4 may also be formed on the back side of the substrate. In some other embodiments, the interconnecting structures 312-1 through 312-4 may penetrate through the substrate.

As shown in FIG. 3B, the interconnecting structure 310 may be vertically aligned with the active region 302. For example, an extension of the interconnecting structure 310 along the Y direction is enclosed by the active region 302. Although not shown, the power rail 314 is also vertically aligned with the active region 302. This may further reduce an area of the decoupling capacitor 300. In some embodiments, such a decoupling capacitor may be referred to as having inbound power.

Figure 4A:
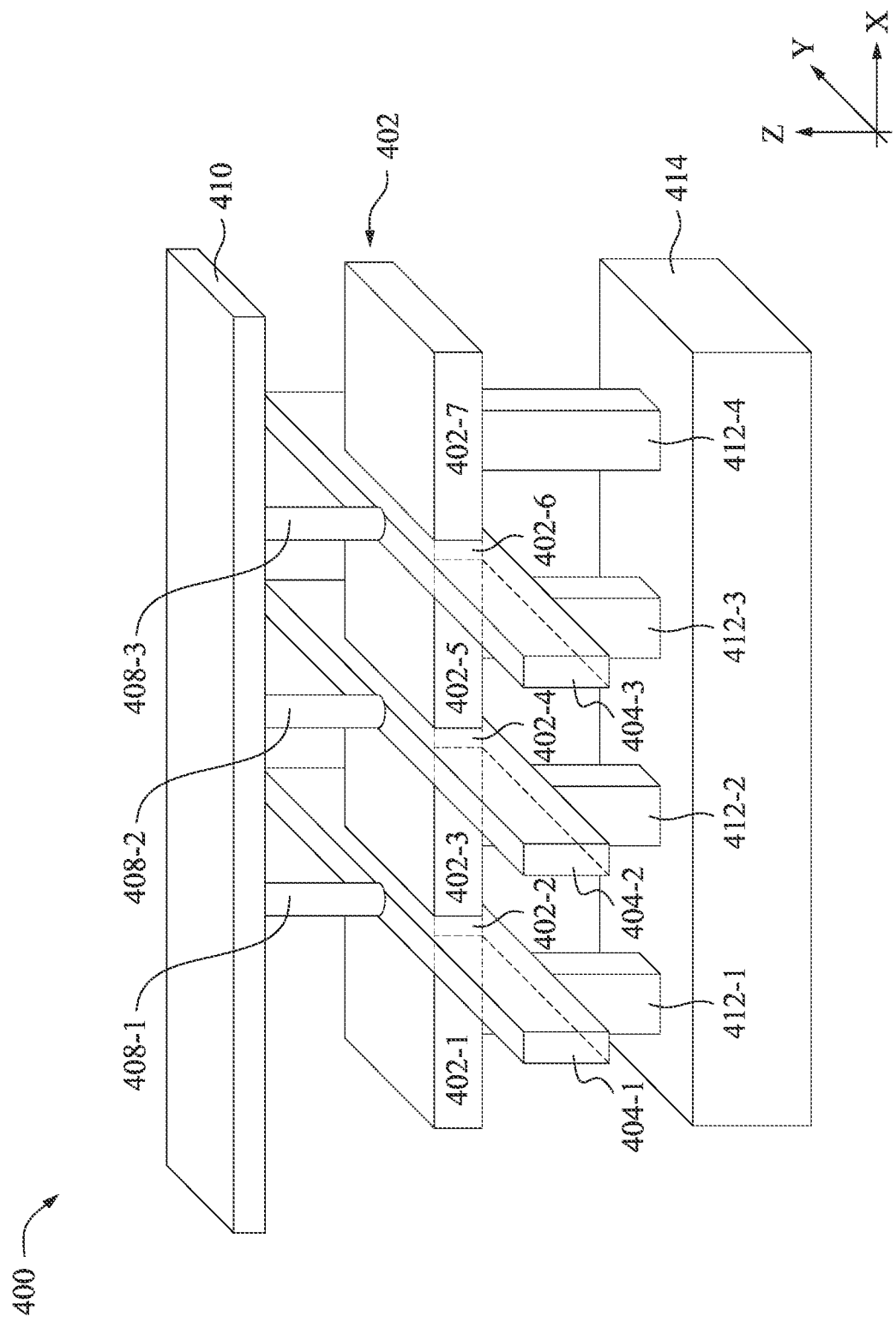
FIGS. 4A and 4B respectively illustrate a perspective view and top view of another example decoupling capacitor, made based on the layout design of FIG. 2, in accordance with some embodiments.
Figure 4B:
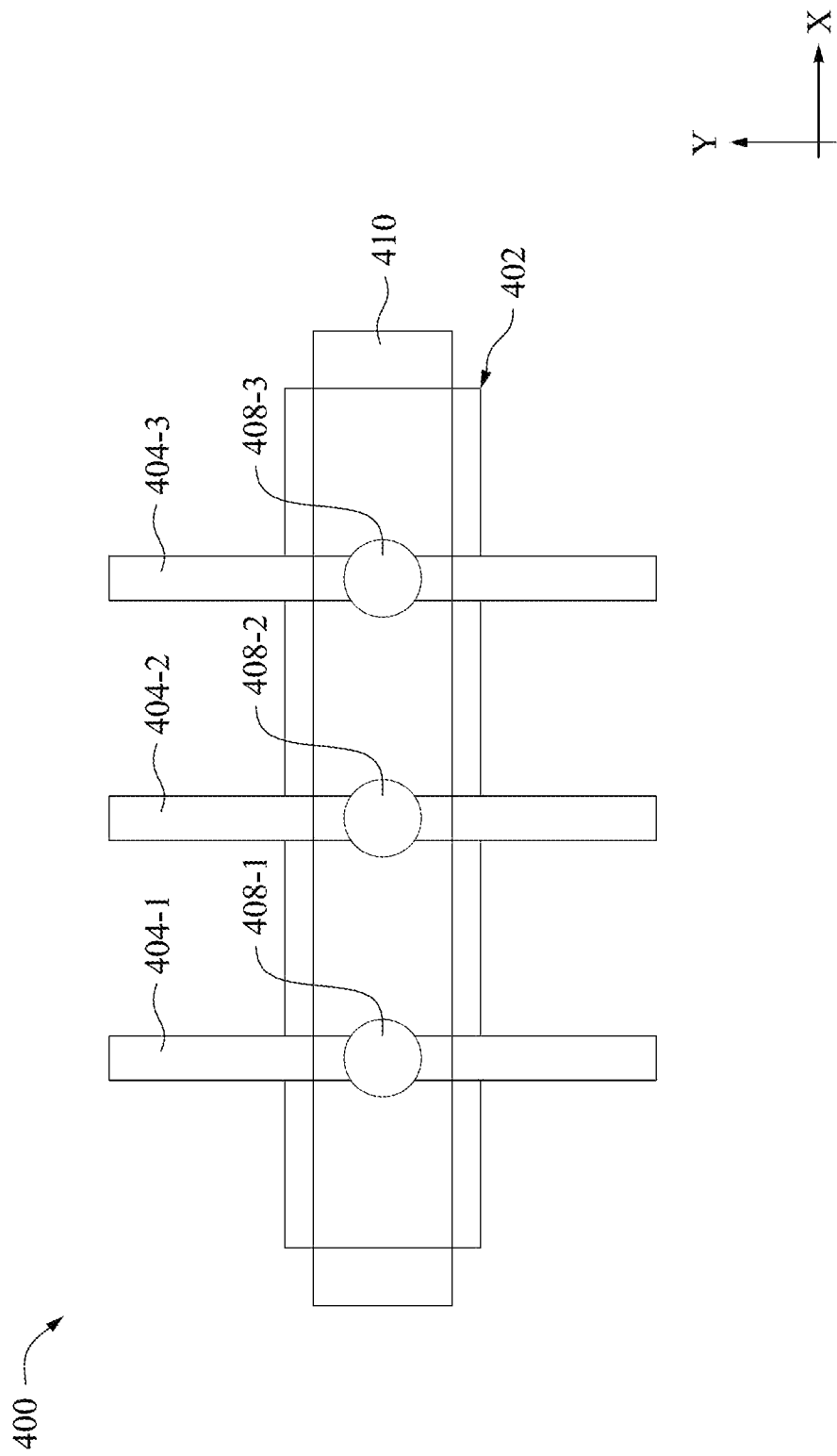

FIG. 4A illustrates a perspective view of another example decoupling capacitor 400, and FIG. 4B illustrates a corresponding top view of the example decoupling capacitor 400. The decoupling capacitor 400 can be fabricated based on at least a portion of the layout design 200 of FIG. 2, e.g., the cell 200A or 200B. For example, the decoupling capacitor 400 includes a number of transistors formed on a front side of a substrate and a power rail formed on a back side of the substrate. Accordingly, the following discussions of FIGS. 4A-B may be in conjunction with FIG. 2. In the illustrated embodiments of FIGS. 4A-B, the transistors constituting the decoupling capacitor 300 are respectively implemented as GAA transistors. However, it should be understood that the transistors can be implemented as any of various other types of transistors, while remaining within the scope of the present disclosure.

As shown in FIG. 4A, the decoupling capacitor 400 includes an active region 402, which may include a number of portions (or sub-regions) 402-1, 402-2, 402-3, 402-4, 402-5, 402-6, and 402-7. The active region 402 may be formed based on the pattern 210 or 260 of FIG. 2. The decoupling capacitor 400 includes (e.g., active) gate structures 404-1, 404-2, and 404-3. The gate structures 404-1 through 404-3 may be formed based on three of the patterns 200-208 of FIG. 2.

In accordance with various embodiments, the gate structure 404-1 can wrap around each of the nanostructures (e.g., nanosheets) of the portion 402-2 that collectively function as the channel of a first GAA transistor; the gate structure 404-2 can wrap around each of the nanostructures (e.g., nanosheets) of the portion 402-4 that collectively function as the channel of a second GAA transistor; and the gate structure 404-3 can wrap around each of the nanostructures (e.g., nanosheets) of the portion 402-6 that collectively function as the channel of a third GAA transistor. Further, the portions 402-1 and 402-3 disposed on opposite sides of the gate structure 404-1 may function as respective source/drain structures of the first GAA transistor; the portions 402-3 and 402-5 disposed on opposite sides of the gate structure 404-2 may function as respective source/drain structures of the second GAA transistor; and the portions 402-5 and 402-7 disposed on opposite sides of the gate structure 404-3 may function as respective source/drain structures of the third GAA transistor.

The decoupling capacitor 400 includes interconnecting structures 408-1, 408-2, and 408-3. The interconnecting structures 408-1 through 408-3 may be formed based on three of the patterns 229-235 or 279-285 of FIG. 2. The interconnecting structures 408-1 through 408-3 are disposed over (e.g., electrically connected to) the gate structures 404-1-3, respectively. Such interconnecting structures 408-1 through 408-3, connecting to the gate structures, may sometimes be referred to as VG. The decoupling capacitor 400 further includes an interconnecting structure 410. The interconnecting structures 410 may be formed based on the pattern 236 or 286 of FIG. 2. The interconnecting structure 410 can electrically tie the gate structures 404-1 through 404-3 together through the interconnecting structures 408-1-3.

In some embodiments, the active region 402, the gate structures 404-1 through 404-3, and the interconnecting structures 408-1 through 408-3, and 410 are formed on a front side of a substrate (not shown). Specifically, the interconnecting structure 410 may be disposed in one of a number of metallization layers on the front side (e.g., a bottommost metallization layer on the front side, typically referred to as M0). The substrate may include a semiconductor material substrate, for example, silicon. Alternatively, the substrate may include other elementary semiconductor material such as, for example, germanium. The substrate may also include a compound semiconductor such as silicon carbide, gallium arsenic, indium arsenide, and indium phosphide. The substrate may include an alloy semiconductor such as silicon germanium, silicon germanium carbide, gallium arsenic phosphide, and gallium indium phosphide. In one embodiment, the substrate includes an epitaxial layer. For example, the substrate may have an epitaxial layer overlying a bulk semiconductor. Furthermore, the substrate may include a semiconductor-on-insulator (SOI) structure. For example, the substrate may include a buried oxide (BOX) layer formed by a process such as separation by implanted oxygen (SIMOX) or other suitable technique, such as wafer bonding and grinding.

On a back side of the substrate, the decoupling capacitor 400 further includes a power rail 414 configured to carry VDD or VSS. The power rail 414 may be disposed in one of a number of metallization layers on the back side (e.g., a bottommost metallization layer on the back side, typically referred to as BM0). The power rail 414 may be formed based on the pattern 228 or 278 of FIG. 2. The power rail 414 is electrically connected to the source/drain structures 402-1, 402-3, 402-5, and 402-7 through interconnecting structures 412-1, 412-2, 412-3, and 412-4, respectively. The interconnecting structures 412-1-4 may be formed based on four of the patterns 220-227 or 270-277 of FIG. 2. The interconnecting structures 412-1 through 412-4, connecting one or more back side interconnecting structures, may sometimes be referred to as VB. In some embodiments, the interconnecting structures 412-1 through 412-4 may also be formed on the back side of the substrate. In some other embodiments, the interconnecting structures 412-1 through 412-4 may penetrate through the substrate.

As shown in FIG. 4B, the interconnecting structure 410 may be vertically aligned with the active region 402. For example, an extension of the interconnecting structure 410 along the Y direction is enclosed by the active region 402. Although not shown, the power rail 414 is also vertically aligned with the active region 402. This may further reduce an area of the decoupling capacitor 300. In some embodiments, such a decoupling capacitor may be referred to as having inbound power.

Figure 5A:
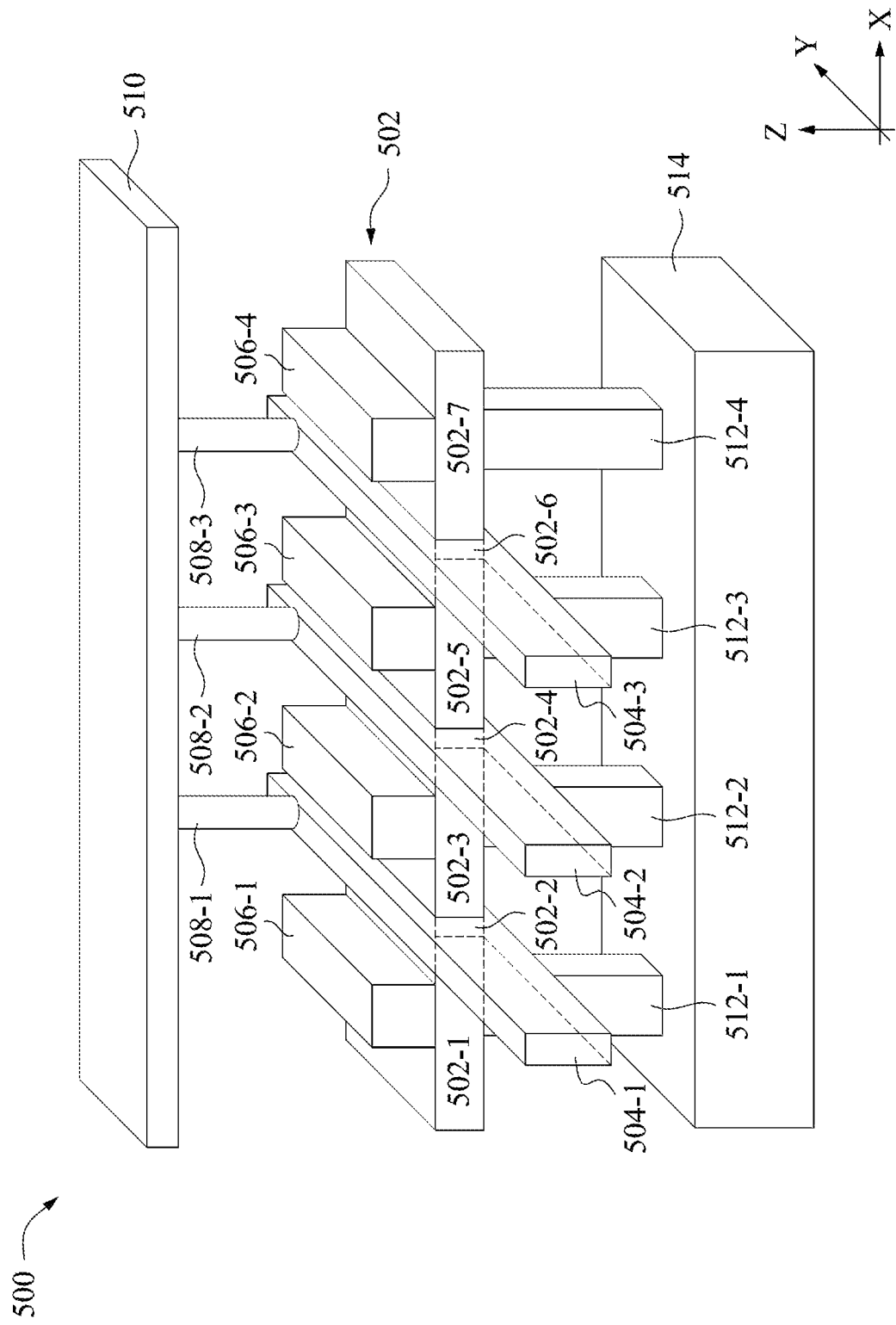
FIGS. 5A and 5B respectively illustrate a perspective view and top view of yet another example decoupling capacitor, made based on the layout design of FIG. 2, in accordance with some embodiments.
Figure 5B:
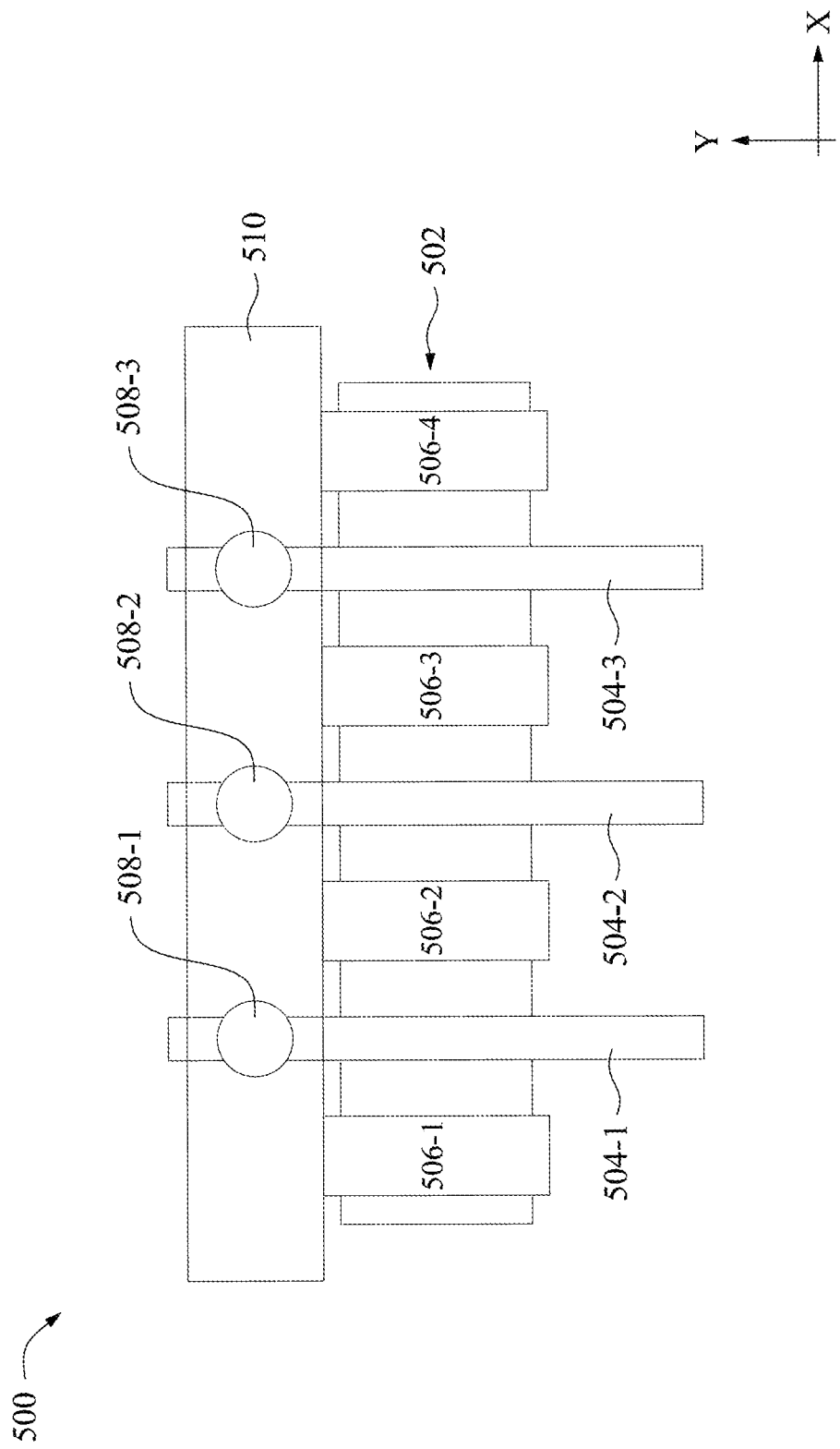

FIG. 5A illustrates a perspective view of yet another example decupling capacitor 500, and FIG. 5B illustrates a corresponding top view of the example decoupling capacitor 500. The decoupling capacitor 500 can be fabricated based on at least a portion of the layout design 200 of FIG. 2, e.g., the cell 200A or 200B. For example, the decoupling capacitor 500 includes a number of transistors formed on a front side of a substrate and a power rail formed on a back side of the substrate. Accordingly, the following discussions of FIGS. 5A-B may be in conjunction with FIG. 2. In the illustrated embodiments of FIGS. 5A-B, the transistors constituting the decoupling capacitor 500 are respectively implemented as GAA transistors. However, it should be understood that the transistors can be implemented as any of various other types of transistors, while remaining within the scope of the present disclosure.

As shown in FIG. 5A, the decoupling capacitor 500 includes an active region 502, which may include a number of portions (or sub-regions) 502-1, 502-2, 502-3, 502-4, 502-5, 502-6, and 502-7. The active region 502 may be formed based on the pattern 210 or 260 of FIG. 2. The decoupling capacitor 500 includes (e.g., active) gate structures 504-1, 504-2, and 504-3. The gate structures 504-1 through 504-3 may be formed based on three of the patterns 201-208 of FIG. 2.

In accordance with various embodiments, the gate structure 504-1 can wrap around each of the nanostructures (e.g., nanosheets) of the portion 502-2 that collectively function as the channel of a first GAA transistor; the gate structure 504-2 can wrap around each of the nanostructures (e.g., nanosheets) of the portion 502-4 that collectively function as the channel of a second GAA transistor; and the gate structure 504-3 can wrap around each of the nanostructures (e.g., nanosheets) of the portion 502-6 that collectively function as the channel of a third GAA transistor. Further, the portions 502-1 and 502-3 disposed on opposite sides of the gate structure 504-1 may function as respective source/drain structures of the first GAA transistor; the portions 502-3 and 502-5 disposed on opposite sides of the gate structure 504-2 may function as respective source/drain structures of the second GAA transistor; and the portions 502-5 and 502-7 disposed on opposite sides of the gate structure 504-3 may function as respective source/drain structures of the third GAA transistor.

The decoupling capacitor 500 includes interconnecting structures 506-1, 506-2, 506-3, and 506-4 disposed over (e.g., electrically connected to) the portions (source/drain structures) 502-1, 502-3, 502-5, and 502-7, respectively. Such interconnecting structures 506-1-4, connecting to the source/drain structures, may sometimes be referred to as MD. By including one or more such MDs, a total capacitance value of the decoupling capacitor 500 may be increased. The decoupling capacitor 500 further includes interconnecting structures 508-1, 508-2, and 508-3. The interconnecting structures 508-1 through 508-3 may be formed based on three of the patterns 229-235 or 279-285 of FIG. 2. The interconnecting structures 508-1 through 508-3 are disposed over (e.g., electrically connected to) the gate structures 504-1 through 504-3, respectively. Such interconnecting structures 508-1 through 508-3, connecting to the gate structures, may sometimes be referred to as VG. The decoupling capacitor 500 further includes an interconnecting structure 510. The interconnecting structures 510 may be formed based on the pattern 236 or 286 of FIG. 2. The interconnecting structure 510 can electrically tie the gate structures 504-1 through 504-3 together through the interconnecting structures 508-1 through 508-3.

In some embodiments, the active region 502, the gate structures 504-1-3, and the interconnecting structures 506-1 through 506-4, 508-1 through 508-3, and 510 are formed on a front side of a substrate (not shown). Specifically, the interconnecting structure 510 may be disposed in one of a number of metallization layers on the front side (e.g., a bottommost metallization layer on the front side, typically referred to as M0). The substrate may include a semiconductor material substrate, for example, silicon. Alternatively, the substrate may include other elementary semiconductor material such as, for example, germanium. The substrate may also include a compound semiconductor such as silicon carbide, gallium arsenic, indium arsenide, and indium phosphide. The substrate may include an alloy semiconductor such as silicon germanium, silicon germanium carbide, gallium arsenic phosphide, and gallium indium phosphide. In one embodiment, the substrate includes an epitaxial layer. For example, the substrate may have an epitaxial layer overlying a bulk semiconductor. Furthermore, the substrate may include a semiconductor-on-insulator (SOI) structure. For example, the substrate may include a buried oxide (BOX) layer formed by a process such as separation by implanted oxygen (SIMOX) or other suitable technique, such as wafer bonding and grinding.

On a back side of the substrate, the decoupling capacitor 500 further includes a power rail 514 configured to carry VDD or VSS. The power rail 514 may be disposed in one of a number of metallization layers on the back side (e.g., a bottommost metallization layer on the back side, typically referred to as BM0). The power rail 514 may be formed based on the pattern 228 or 278 of FIG. 2. The power rail 514 is electrically connected to the source/drain structures 502-1, 502-3, 502-5, and 502-7 through interconnecting structures 512-1, 512-2, 512-3, and 512-4, respectively. The interconnecting structures 512-1-4 may be formed based on four of the patterns 220-227 or 270-277 of FIG. 2. The interconnecting structures 512-1 through 512-4, connecting one or more back side interconnecting structures, may sometimes be referred to as VB. In some embodiments, the interconnecting structures 512-1 through 512-4 may also be formed on the back side of the substrate. In some other embodiments, the interconnecting structures 512-1 through 512-4 may penetrate through the substrate.

As shown in FIG. 5B, the interconnecting structure 510 may be vertically displaced from the active region 502. For example, none of the extension of the interconnecting structure 510 along the Y direction overlaps the active region 502. Although not shown, the power rail 514, however, is vertically aligned with the active region 502. In some embodiments, such a decoupling capacitor may be referred to as having outbound power.

Figure 6A:
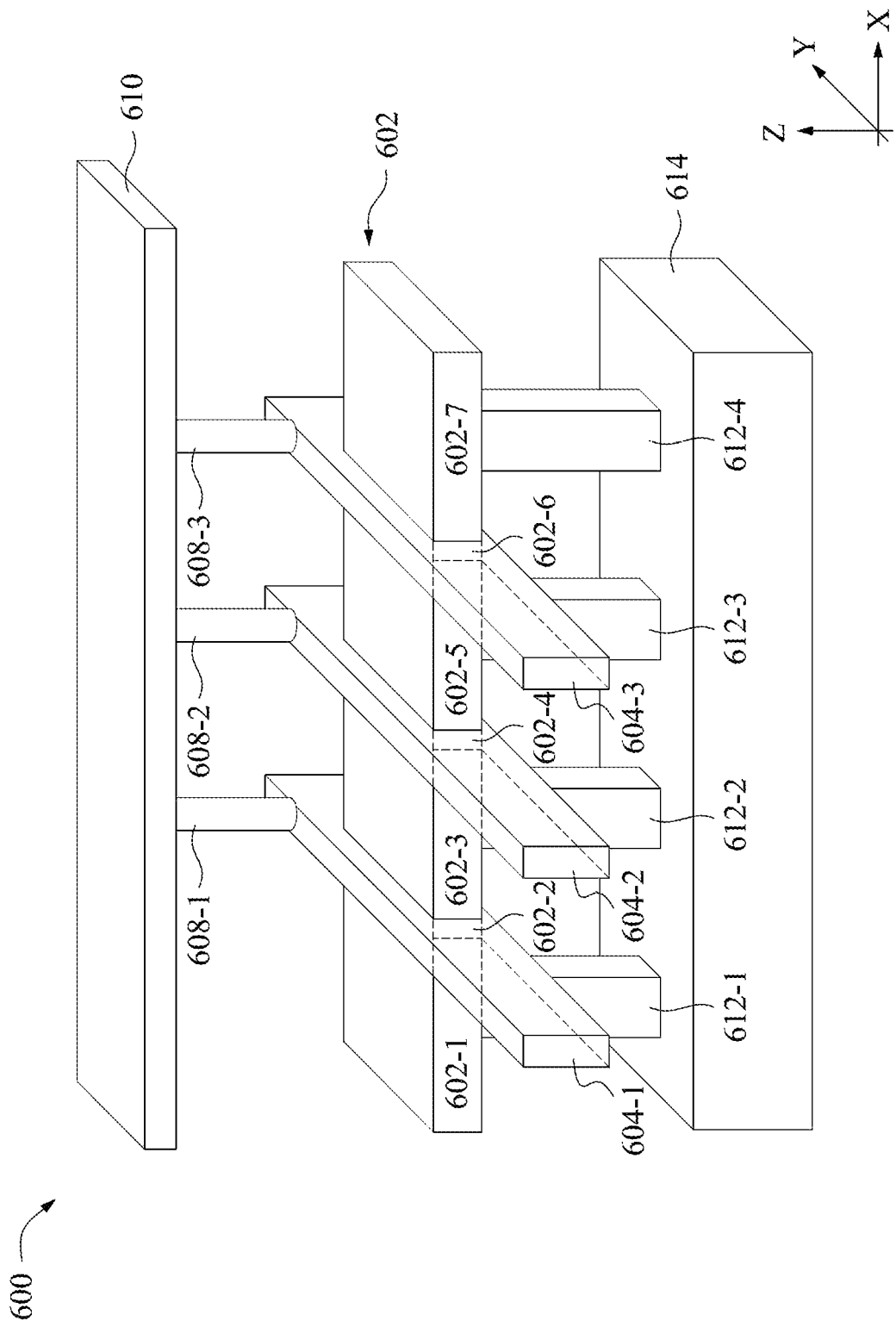
FIGS. 6A and 6B respectively illustrate a perspective view and top view of yet another example decoupling capacitor, made based on the layout design of FIG. 2, in accordance with some embodiments.
Figure 6B:
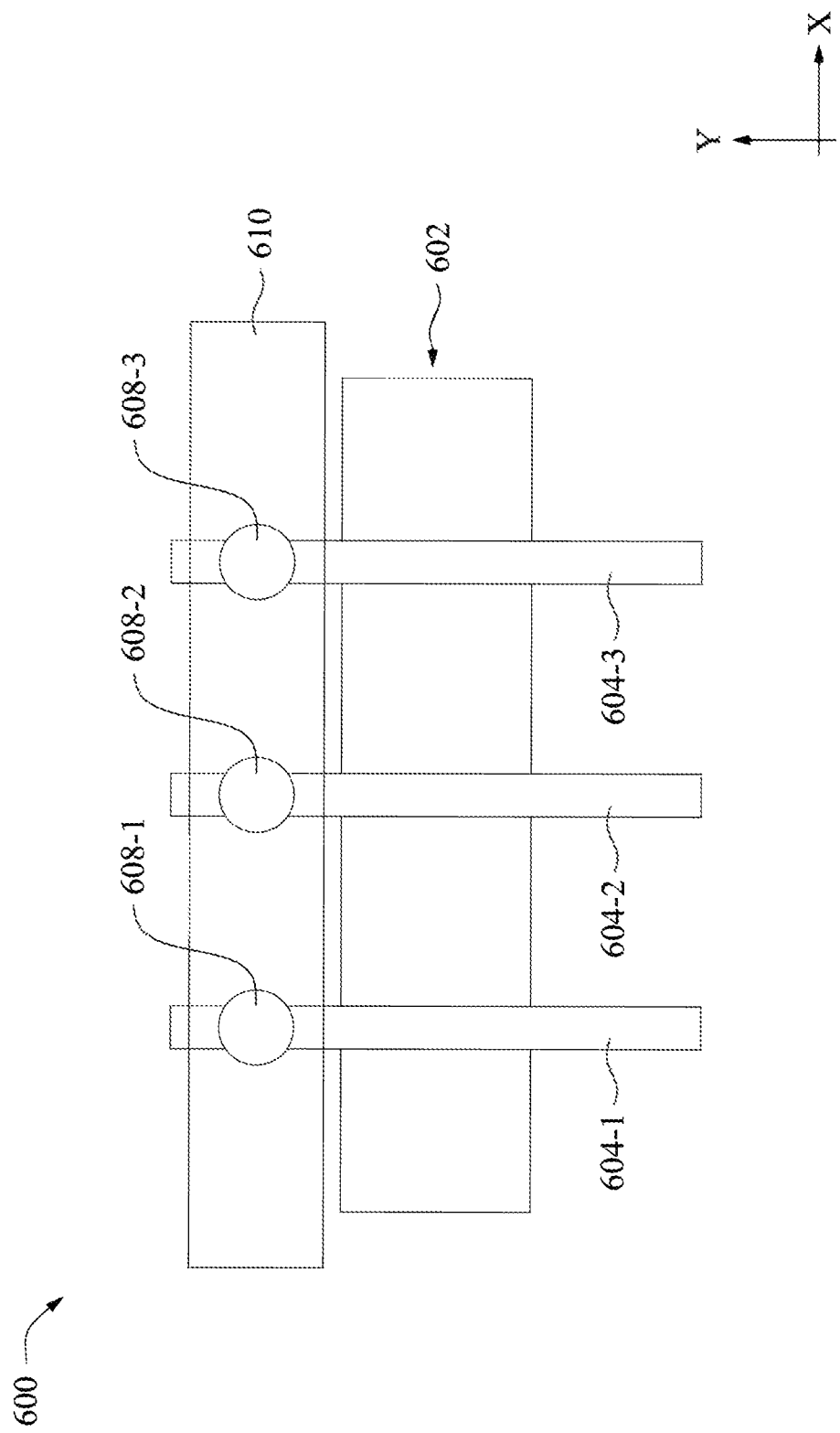

FIG. 6A illustrates a perspective view of yet another example decupling capacitor 600, and FIG. 6B illustrates a corresponding top view of the example decoupling capacitor 600. The decoupling capacitor 600 can be fabricated based on at least a portion of the layout design 200 of FIG. 2, e.g., the cell 200A or 200B. For example, the decoupling capacitor 600 includes a number of transistors formed on a front side of a substrate and a power rail formed on a back side of the substrate. Accordingly, the following discussions of FIGS. 6A-B may be in conjunction with FIG. 2. In the illustrated embodiments of FIGS. 6A-B, the transistors constituting the decoupling capacitor 300 are respectively implemented as GAA transistors. However, it should be understood that the transistors can be implemented as any of various other types of transistors, while remaining within the scope of the present disclosure.

As shown in FIG. 6A, the decoupling capacitor 600 includes an active region 602, which may include a number of portions (or sub-regions) 602-1, 602-2, 602-3, 602-4, 602-5, 602-6, and 602-7. The active region 602 may be formed based on the pattern 210 or 260 of FIG. 2. The decoupling capacitor 600 includes (e.g., active) gate structures 604-1, 604-2, and 604-3. The gate structures 604-1 through 604-3 may be formed based on three of the patterns 201-208 of FIG. 2.

In accordance with various embodiments, the gate structure 604-1 can wrap around each of the nanostructures (e.g., nanosheets) of the portion 602-2 that collectively function as the channel of a first GAA transistor; the gate structure 604-2 can wrap around each of the nanostructures (e.g., nanosheets) of the portion 602-4 that collectively function as the channel of a second GAA transistor; and the gate structure 604-3 can wrap around each of the nanostructures (e.g., nanosheets) of the portion 602-6 that collectively function as the channel of a third GAA transistor. Further, the portions 602-1 and 602-3 disposed on opposite sides of the gate structure 604-1 may function as respective source/drain structures of the first GAA transistor; the portions 602-3 and 602-5 disposed on opposite sides of the gate structure 604-2 may function as respective source/drain structures of the second GAA transistor; and the portions 602-5 and 602-7 disposed on opposite sides of the gate structure 604-3 may function as respective source/drain structures of the third GAA transistor.

The decoupling capacitor 600 includes interconnecting structures 608-1, 608-2, and 608-3. The interconnecting structures 608-1 through 608-3 may be formed based on three of the patterns 229-235 or 279-285 of FIG. 2. The interconnecting structures 608-1 through 608-3 are disposed over (e.g., electrically connected to) the gate structures 604-1 through 604-3, respectively. Such interconnecting structures 608-1 through 608-3, connecting to the gate structures, may sometimes be referred to as VG. The decoupling capacitor 600 further includes an interconnecting structure 610. The interconnecting structures 610 may be formed based on the pattern 236 or 286 of FIG. 2. The interconnecting structure 610 can electrically tie the gate structures 604-1 through 604-3 together through the interconnecting structures 608-1 through 608-3.

In some embodiments, the active region 602, the gate structures 604-1 through 604-3, and the interconnecting structures 608-1-3, and 610 are formed on a front side of a substrate (not shown). Specifically, the interconnecting structure 610 may be disposed in one of a number of metallization layers on the front side (e.g., a bottommost metallization layer on the front side, typically referred to as M0). The substrate may include a semiconductor material substrate, for example, silicon. Alternatively, the substrate may include other elementary semiconductor material such as, for example, germanium. The substrate may also include a compound semiconductor such as silicon carbide, gallium arsenic, indium arsenide, and indium phosphide. The substrate may include an alloy semiconductor such as silicon germanium, silicon germanium carbide, gallium arsenic phosphide, and gallium indium phosphide. In one embodiment, the substrate includes an epitaxial layer. For example, the substrate may have an epitaxial layer overlying a bulk semiconductor. Furthermore, the substrate may include a semiconductor-on-insulator (SOI) structure. For example, the substrate may include a buried oxide (BOX) layer formed by a process such as separation by implanted oxygen (SIMOX) or other suitable technique, such as wafer bonding and grinding.

On a back side of the substrate, the decoupling capacitor 600 further includes a power rail 614 configured to carry VDD or VSS. The power rail 614 may be disposed in one of a number of metallization layers on the back side (e.g., a bottommost metallization layer on the back side, typically referred to as BM0). The power rail 614 may be formed based on the pattern 228 or 278 of FIG. 2. The power rail 614 is electrically connected to the source/drain structures 602-1, 602-3, 602-5, and 602-7 through interconnecting structures 612-1, 612-2, 612-3, and 612-4, respectively. The interconnecting structures 612-1-4 may be formed based on four of the patterns 220-227 or 270-277 of FIG. 2. The interconnecting structures 612-1 through 612-4, connecting one or more back side interconnecting structures, may sometimes be referred to as VB. In some embodiments, the interconnecting structures 612-1-4 may also be formed on the back side of the substrate. In some other embodiments, the interconnecting structures 612-1 through 612-4 may penetrate through the substrate.

As shown in FIG. 6B, the interconnecting structure 610 may be vertically displaced from the active region 602. For example, none of the extension of the interconnecting structure 610 along the Y direction overlaps the active region 602. Although not shown, the power rail 614, however, is vertically aligned with the active region 602. In some embodiments, such a decoupling capacitor may be referred to as having outbound power.

Figure 7A:
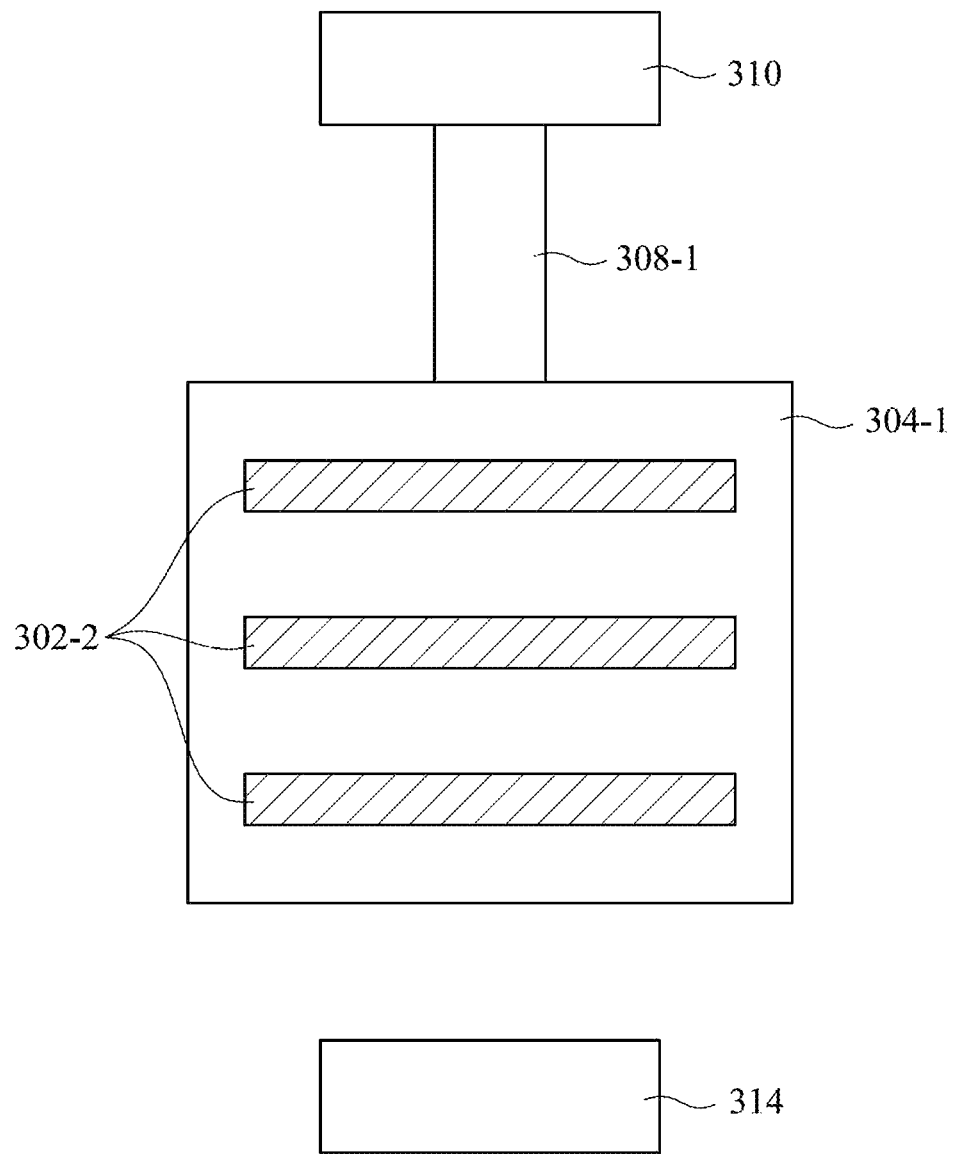
FIGS. 7A and 7B respectively illustrate cross-sectional views of the example decoupling capacitor of FIGS. 3A-B, cut along different directions, in accordance with some embodiments.
Figure 7B:
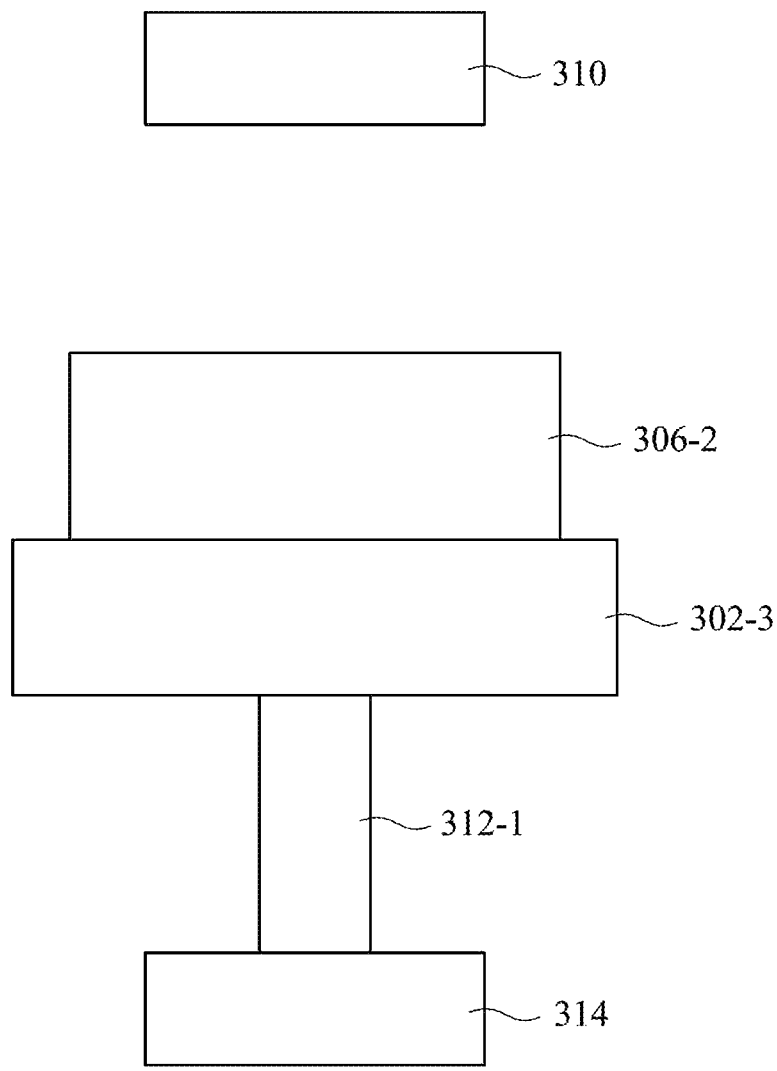

FIGS. 7A and 7B illustrate cross-sectional views of the disclosed decoupling capacitor, cut along different directions, respectively. Using the decoupling capacitor 300 of FIGS. 3A-B as a representative example, FIG. 7A illustrates a cross-sectional view of the decoupling capacitor 300 that is cut along direction A-A (as indicated in FIG. 3A); and FIG. 7B illustrates a cross-sectional view of the decoupling capacitor 300 that is cut along direction B-B (as indicated in FIG. 3A). As shown in FIGS. 7A-B, the portion 302-2 includes a number of nanostructures (filled by diagonal stripes) and the gate structure 304-1 wraps around each of the nanostructures, while portion 302-3, which functions as a source/drain structure, is coupled to the power rail 314 via the interconnecting structure 312-1.

Figure 8:
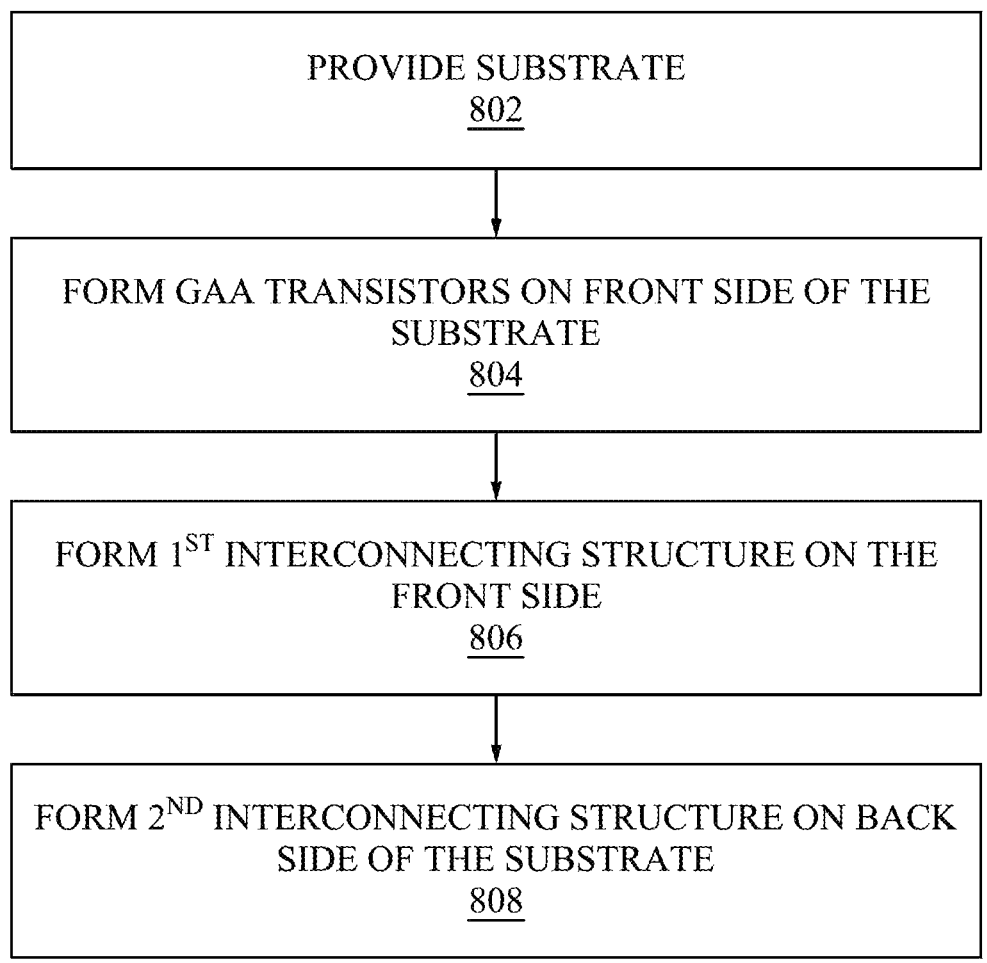
FIG. 8 illustrates a flow chart of a method to make a decoupling capacitor, in accordance with some embodiments.

FIG. 8 illustrates a flow chart of a method 800 to make the disclosed decoupling capacitor (e.g., 300 of FIGS. 3A-B, 400 of FIGS. 4A-B, 500 of FIGS. 5A-B, 600 of FIGS. 6A-B), according to various embodiments of the present disclosure. At least some operations of the method 800 can be used to form the decoupling capacitor that includes one or more non-planar structures. For example, the decoupling capacitor may include one or more gate-all-around (GAA) transistors. However, it should be understood that the transistors of the decoupling capacitor may be each configured in any of various other types of transistors such as, for example, a FinFET, a planar complementary metal-oxide-semiconductor (CMOS) transistor, while remaining within the scope of the present disclosure.

It is noted that the method 800 is merely an example, and is not intended to limit the present disclosure. Accordingly, it should be understood that additional operations may be provided before, during, and/or after the method 800, and that some other operations may only be briefly described herein. Some operations of the method 800 may be associated with the views shown in FIGS. 3A-7B, and thus, the following discussions of the method 800 may refer to one or more components of FIGS. 3A-7B.

In brief overview, the method 800 starts with operation 802 of providing a semiconductor substrate. The method 800 proceeds to operation 804 of forming a number of GAA transistors on a front side of the semiconductor substrate. The method 800 proceeds to operation 806 of forming a first interconnecting structure on the front side. The first interconnecting structure is configured to connect respective gate structures of the GAA transistors. The method 800 proceeds to operation 808 of forming a second interconnecting structure on a back side of the semiconductor substrate. The second interconnecting structure may function as a power rail. In some embodiments, a decoupling capacitor can be formed between the first and second interconnecting structures.

Corresponding to operation 802, the semiconductor substrate may be a semiconductor substrate, such as a bulk semiconductor, a semiconductor-on-insulator (SOI) substrate, or the like, which may be doped (e.g., with a p-type or an n-type dopant) or undoped. The substrate may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Corresponding to operation 804, on the front side of the semiconductor substrate, a number of GAA transistors are formed. The GAA transistors may be formed by at least some of the following process steps: forming a fin structure protruding from the substrate, wherein the fin structure includes a number of first nanostructures and a number of second nanostructures alternately stacked on top of one another; forming a number of dummy gate structures straddling the fin structure; forming one or more pairs of source/drain structures in the fin structure, each pair disposed on opposite sides of each of the dummy gate structures; removing the dummy gate structures; removing the first nanostructures; and forming a number of active (e.g., metal) gate structures.

In some embodiments, each of the GAA transistors includes a respective one of the active gate structures (e.g., 304-1 through 304-3 of FIGS. 3A-B, 404-1 through 404-3 of FIGS. 4A-B, 504-1 through 504-3 of FIGS. 5A-B, 604-1 through 604-3 of FIGS. 6A-B) wrapping around each of a number of the second nanostructures (e.g., 302-2, 302-4, and 302-6 of FIGS. 3A-B, 402-2, 402-4, and 402-6 of FIGS. 4A-B, 502-2, 502-4, and 502-6 of FIGS. 5A-B, 602-2, 602-4, and 602-6 of FIGS. 6A-B), and a respective pair of the source/drain structures (e.g., 302-1, 302-3, 302-5, and 302-7 of FIGS. 3A-B, 402-1, 402-3, 402-5, and 402-7 of FIGS. 4A-B, 502-1, 502-3, 502-5, and 502-7 of FIGS. 5A-B, 602-1, 602-3, 602-5, and 602-7 of FIGS. 6A-B). The source/drain structures are coupled to respective ends of each of nanostructures. In some embodiments, the source/drain structures of neighboring GAA transistors may merge with each other. As such, the GAA transistors are electrically coupled in series.

Corresponding to operation 806, on the front side of the semiconductor substrate, the first interconnecting structure is formed. The first interconnecting structure can connect the respective gate structures of the GAA transistors together. For example in FIGS. 3A-B, the first interconnecting structure 310 connects the gate structures 304-1 through 304-3 together; for example in FIGS. 4A-B, the first interconnecting structure 410 connects the gate structures 404-1 through 404-3 together; for example in FIGS. 5A-B, the first interconnecting structure 510 connects the gate structures 504-1 through 504-3 together; and for example in FIGS. 6A-B, the first interconnecting structure 610 connects the gate structures 604-1 through 604-3 together.

Corresponding to operation 808, on the back side of the substrate, the second interconnecting structure is formed. The second interconnecting structure may function as a power rail. The power rail may be formed by at least some of the following process steps: flipping the semiconductor substrate; thinning the semiconductor substrate from the back side to expose respective bottom surface of the source/drain structures; forming a number of via structures connecting each of the (merged) source/drain structures; and forming the second interconnecting structure connecting the via structures together. As such, the second interconnecting structure can connect the respective source/drain structures of the GAA transistors together.

For example in FIGS. 3A-B, the second interconnecting structure 314 connects the source/drain structures 302-1, 302-3, 302-5, and 302-7 together; for example in FIGS. 4A-B, the second interconnecting structure 414 connects the source/drain structures 402-1, 402-3, 402-5, and 402-7 together; for example in FIGS. 5A-B, the second interconnecting structure 514 connects the source/drain structures 502-1, 502-3, 502-5, and 502-7 together; and for example in FIGS. 6A-B, the second interconnecting structure 614 connects the source/drain structures 602-1, 602-3, 602-5, and 602-7 together.

In one aspect of the present disclosure, a semiconductor device is disclosed. The semiconductor device includes a substrate having a first side and a second side; an active region arranged on the first side, extending along a first lateral direction and including a first conduction type of dopants; a first gate structure arranged on the first side, extending along a second lateral direction perpendicular to the first lateral direction, disposed over the active region, and wrapping a first portion of the active region; a first interconnecting structure arranged on the first side, electrically coupled to the first gate structure, and disposed over the first gate structure; and a second interconnecting structure arranged on the second side, electrically coupled to one or more portions of the active region. The active region, the first gate structure, the first interconnecting structure, and the second interconnecting structure are collectively configured as a decoupling capacitor.

In another aspect of the present disclosure, a semiconductor device includes a substrate having a first side and a second side. The semiconductor device includes, on the first side: an active region that extends along a first lateral direction; a plurality of gate structures that each extends along a second lateral direction perpendicular to the first lateral direction and is disposed over the active region; and a first interconnecting structure electrically coupled to a first gate structure of the plurality of gate structures. The semiconductor device also includes, on the second side: a second interconnecting structure; and a plurality of third interconnecting structures electrically coupling the second interconnecting structure to one or more portions of the active region. The active region, the first gate structure, the first interconnecting structure, and the second interconnecting structure are collectively configured as a decoupling capacitor.

In yet another aspect of the present disclosure, a method for fabricating a semiconductor device is disclosed. The method includes: forming, over a front side of a substrate, an active region that extends along a first lateral direction and includes a first sub-region and a second sub-region; forming, over the active region, a plurality of gate structures that each extends along a second lateral direction perpendicular to the first lateral direction; forming, over the plurality of gate structures, a first interconnecting structure that is electrically coupled to a first gate structure of the plurality of gate structures; and forming, over a back side of the substrate opposite to the front side, a second interconnecting structure that is electrically coupled to one or more portions of the active region. The active region, the first gate structure, the first interconnecting structure, and the second interconnecting structure are collectively configured as a decoupling capacitor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a substrate having a first side and a second side;
    an active region arranged on the first side, extending along a first lateral direction and comprising a first conduction type of dopants;
    a first gate structure arranged on the first side, extending along a second lateral direction perpendicular to the first lateral direction, disposed over the active region, and wrapping a first portion of the active region;
    a first interconnecting structure arranged on the first side, electrically coupled to the first gate structure, and disposed over the first gate structure; and
    a second interconnecting structure arranged on the second side, electrically coupled to one or more portions of the active region,
    wherein the active region, the first gate structure, the first interconnecting structure, and the second interconnecting structure are collectively configured as a decoupling capacitor.

2. The semiconductor device of claim 1, further comprising:
    a plurality of third interconnecting structures arranged on the second side and electrically coupling the second interconnecting structure to the one or more portions of the active region.

3. The semiconductor device of claim 1, wherein the semiconductor device also comprises:
    a second gate structure arranged on the first side, extending along the second lateral direction perpendicular, disposed over the active region, and wrapping a second portion of the active region.

4. The semiconductor device of claim 1, wherein the second interconnecting structure is electrically coupled to the first and the second sub-regions and is configured to provide a power supply.

5. The semiconductor device of claim 4, wherein the power supply is VSS.

6. The semiconductor device of claim 4, wherein the power supply is VDD.

7. A semiconductor device, comprising:
    a substrate having a first side and a second side;
    wherein the semiconductor device comprises, on the first side:
        an active region that extends along a first lateral direction;
        a plurality of gate structures that each extends along a second lateral direction perpendicular to the first lateral direction and is disposed over the active region; and
        a first interconnecting structure electrically coupled to a first gate structure of the plurality of gate structures;
    wherein the semiconductor device also comprises, on the second side:
        a second interconnecting structure; and
        a plurality of third interconnecting structures electrically coupling the second interconnecting structure to one or more portions of the active region; and
    wherein the active region, the first gate structure, the first interconnecting structure, and the second interconnecting structure are collectively configured as a decoupling capacitor.

8. The semiconductor device of claim 7, wherein the active region comprises a first sub-region and a second sub-region that are disposed on opposite sides of the first gate structure along the first lateral direction.

9. The semiconductor device of claim 8, wherein the second interconnecting structure is electrically coupled to the first and the second sub-regions and is configured to provide a power supply.

10. The semiconductor device of claim 9, wherein each of the first and the second sub-regions includes n-type dopants and the power supply is VSS.

11. The semiconductor device of claim 9, wherein each of the first and the second sub-regions includes p-type dopants and the power supply is VDD.

12. The semiconductor device of claim 7, wherein the first and the second interconnecting structures both extend along the first lateral direction.

13. The semiconductor device of claim 7, wherein the active region comprises one or more first nanostructures vertically separated from each other.

14. The semiconductor device of claim 13, wherein the first gate structure wraps around each of the one or more first nanostructures.

15. The semiconductor device of claim 7, wherein a second gate structure of the plurality of gate structures, on the first side of the substrate, extends along the second lateral direction, with a third sub-region and a fourth sub-region of the active region disposed on opposite sides of the second gate structure.

16. The semiconductor device of claim 15, wherein the first interconnecting structure is electrically coupled to the second gate structure, and wherein the second interconnecting structure is electrically coupled to the third and fourth sub-regions.

17. The semiconductor device of claim 7, wherein the first interconnecting structure is displaced from the active region along the second lateral direction.

18. A method for fabricating a semiconductor device, comprising:
    forming, over a front side of a substrate, an active region that extends along a first lateral direction and comprises a first sub-region and a second sub-region;
    forming, over the active region, a plurality of gate structures that each extends along a second lateral direction perpendicular to the first lateral direction;
    forming, over the plurality of gate structures, a first interconnecting structure that is electrically coupled to a first gate structure of the plurality of gate structures; and
    forming, over a back side of the substrate opposite to the front side, a second interconnecting structure that is electrically coupled to one or more portions of the active region,
    wherein the active region, the first gate structure, the first interconnecting structure, and the second interconnecting structure are collectively configured as a decoupling capacitor.

19. The method of claim 18, wherein the second interconnecting structure is electrically coupled to the one or more portions of the active region by a plurality of third interconnecting structures that is formed over the back side of the substrate.

20. The method of claim 18, wherein the second interconnecting structure is configured to provide a power supply.

* * * * *